United States Patent [19]

Byrne et al.

[11] Patent Number: 5,346,855
[45] Date of Patent: Sep. 13, 1994

[54] METHOD OF MAKING AN INP-BASED DFB LASER

[75] Inventors: Erin K. Byrne, Piscataway; Utpal K. Chakrabarti, Scotch Plains; Todd R. Hayes, Plainfield, all of N.J.

[73] Assignee: AT&T Bell Laboratories, Murray Hill, N.J.

[21] Appl. No.: 6,352

[22] Filed: Jan. 19, 1993

[51] Int. Cl.$^5$ ............................................. H01L 21/20
[52] U.S. Cl. .................................... 437/129; 437/126; 437/130; 437/228; 148/DIG. 72; 148/DIG. 95
[58] Field of Search ............... 437/129, 130, 126, 228; 148/DIG. 72, DIG. 95

[56] References Cited

U.S. PATENT DOCUMENTS

| 4,716,132 | 12/1987 | Hirata | 437/129 |
| 4,782,035 | 11/1988 | Fujiwara | 437/129 |
| 5,079,185 | 1/1992 | Kagawa et al. | 437/129 |
| 5,192,710 | 3/1993 | Schilling | 437/129 |
| 5,228,047 | 7/1993 | Matsumoto et al. | 372/45 |

Primary Examiner—Tom Thomas
Assistant Examiner—Kevin M. Picardat
Attorney, Agent, or Firm—Eugen E. Pacher

[57] ABSTRACT

Disclosed is a method of making InP-based DFB lasers that can reliably mitigate or substantially prevent erosion of the grating during overgrowth. The method comprises contacting, prior to overgrowth, the grating with a sulfurcontaining aqueous medium, e.g., 80 parts by weight $H_2O$/20 parts by weight ammonium sulfide.

6 Claims, 2 Drawing Sheets

METHOD OF MAKING AN INP-BASED DFB LASER

FIELD OF THE INVENTION

This invention pertains to methods of making an InP-based semiconductor laser that comprises a Bragg grating.

BACKGROUND OF THE INVENTION

Semiconductor lasers are widely used and have reached a high state of development. For instance, lasers have been developed that can have relatively narrow linewidths. Such lasers are potentially important for, e.g., coherent optical communication systems. Semiconductor lasers are typically grown by some vapor deposition technique, e.g., by metal organic vapor phase epitaxy (MOVPE).

Lasers that comprise distributed feedback means (such lasers are usually referred to as DFB lasers) have the potential of achieving very narrow linewidths, since the radiation reflected from the feedback means into the laser cavity can have a very narrow frequency range. The distributed feedback means typically comprise a "grating", exemplarily a regular sequence of elevated and depressed regions in the surface of a semiconductor layer, overgrown with material of different refractive index (exemplarily quaternary material, e.g., InGaAsP), with the interface sufficiently close to the active region of the laser such that the lasing optical field can interact with the grating.

An important substrate material for semiconductor lasers is InP, since it can be used to grow lasers that emit radiation in the approximate 1.3–1.55 μm wavelength region, known to be particularly advantageous for optical fiber communication systems, due to the low loss of $SiO_2$-based optical fiber at some wavelengths in that regime. In InP-based DFB lasers the gratings can be etched in InP or in an InGaAsP layer previously grown on an InP substrate. The gratings typically are produced by photolithography, followed either by wet chemical etching or by reactive ion etching (RIE).

It has often been observed that during growth of a semiconductor material on a grating, the geometrical dimensions (e.g., grating amplitude, duty cycle, or profile) of the grating are changed. The degree of change depends upon the details of the cleaning and/or heat treatment of the grating prior to the growth and also on the method used to grow the overlying semiconductor material. There are various growth methods commonly used; e.g., Liquid Phase Epitaxy (LPE), Metal-Organic Vapor Phase Epitaxy (MOVPE) or Hydride Vapor Phase Epitaxy (HVPE).

Since laser characteristics typically depend significantly on the geometry of the grating, the observed changes can be highly undesirable, especially if the changes are difficult to control. Thus, it would be beneficial to have available a method of making InP-based DFB lasers that can be substantially free (or is at least less subject to) changes in grating geometry. This application discloses such a method.

BRIEF DESCRIPTION OF THE DRAWING

In FIG. 1 no attempt has been made to show exact dimensions and/or proportions.

THE INVENTION

In a broad aspect the invention is embodied in a method of making an article that comprises a InP-based DFB laser. The method comprises providing a phosphorus (P)-containing semiconductor body, exemplarily an InP wafer. It further comprises processing the body such that on at least a portion of the surface of the body are formed grating means, typically an essentially regular sequence of elevated and depressed elongate features. It still further comprises heating the body to a deposition temperature and depositing on at least a part of the grating means epitaxial semiconductor material.

Significantly, the method also comprises contacting, prior to heating the body to the deposition temperature, the grating means with an aqueous medium that contains sulfur, exemplarily ammonium sulfide. By "sulfur" we mean herein not only $S^{-2}$ but also sulfur ions of other valences, e.g., $S^{-3}$.

Figure 1:
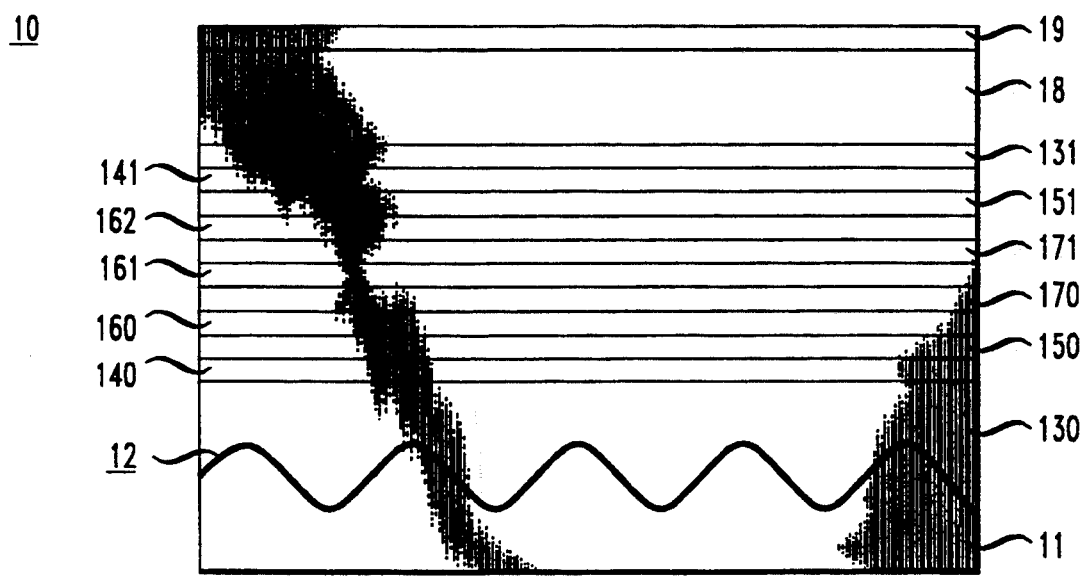
FIG. 1 schematically depicts an exemplary multilayer semiconductor structure according to the invention.

FIG. 1 schematically depicts an exemplary structure 10 suitable for making a DFB laser. Substrate 11 exemplarily is a (100) n-type single crystal InP body, typically a InP wafer. On a major surface of the wafer is formed a regularly spaced sequence of elongate recessed features, which result in grating 12. Exemplarily the features are parallel to the (011) direction and have a repeat distance of about 240 nm. The substrate surface can be patterned by a method that exemplarily comprises holographic photolithography and chemical or reactive ion etching. The recessed features typically have a depth in the range 20–200 nm prior to any heat treatment.

FIG. 1 further shows a multiplicity of single crystal semiconductor layers grown on the patterned surface of the substrate. Layer 130 is InGaAsP of composition having an energy gap corresponding to a wavelength ($\lambda_g$) of 1.08 μm, layers 140 and 150 have $\lambda_g$ of 1.16 and 1.25 μm, respectively, quantum wells 160, 161 and 162 are InGaAs of $\lambda_g = 1.67$ μm, and barrier layers 170 and 171 are InGaAsP of $\lambda_g = 1.25$ μm. Layers 151, 141 and 131 are of essentially the same composition as layers 150, 140 and 130, respectively. Layer 18 is p-InP, and layer 19 is p+ InGaAsP. The art conventionally specifies composition in InP-based semiconductor material in terms of $\lambda_g$, as is done herein. Furthermore, expressions such as "InGaAsP" are well understood to merely list the chemical constituents and not to imply the presence of equimolar amounts of the constituents. Exemplarily, layer 130 is about 130 nm thick, layers 140, 150, 151 and 141 each are about 25 nm thick, barrier layers 170 and 171 each are about 22.5 nm thick, and the quantum well layers 160, 161 and 162 have a thickness in the ranges 5–9 nm.

It will be appreciated that the structure of FIG. 1 is exemplary only, and that the invention is not limited to this particular structure. For instance, lasers according to the invention need not be quantum well lasers, could have fewer or more than three quantum wells, and/or could have a grating above the active region of the laser.

From a structure as shown in FIG. 1 lasers can be made by conventional methods that typically include photolithography, etching, re-growth, cleaving, deposition of contacts, and possibly deposition of reflecting and/or antireflection coatings.

The structure of FIG. 1 exemplarily can be grown according to the invention as follows: after the grating is produced by a conventional technique the InP wafer is subjected to a conventional cleaning treatment, followed by the novel grating-preserving treatment. Specifically, the grating is contacted with (typically immersed in) an aqueous medium that comprises an amount of sulfur that is effective for providing the desired degree of grating protection, typically resulting in residual grating depth of at least 10%, frequently as high as 90% or more, of the "as etched" grating. Exemplarily, the medium is 80 parts by weight $H_2O$ and 20 parts by weight of (standard concentration) ammonium sulfide, the temperature of the medium is 60° C., and the duration of the contact is 10 minutes.

These process parameters are exemplary only. Typically, the sulfur concentration will be in the range 1 mmolar to saturated solution (preferably at least 10 mmolar), the temperature will be in the range 50°-80° C., and the length of contact will be in the range 5-30 minutes. Although currently preferred, ammonium sulfide is not the only sulfur-yielding substance that can be used in the practice of the invention. Exemplary others are sodium sulfide, hydrogen sulfide, arsenic sulfide and phosphorus sulfide.

Subsequent to the grating preservation treatment the wafer exemplarily is heated in conventional manner to the growth temperature (typically in the range 575°-650° C., exemplarily about 625° C.), followed by growth of the sequence of InGaAsP layers 130-150 of FIG. 1. This in turn is followed by growth of the quantum well structure, which is followed by growth of the InGaAsP layers 151-131, of the (exemplarily 0.6 μm thick) p-InP cladding layer 18, and of the (exemplarily 120 nm thick) p+-InGaAsP ($5 \times 10^{18} cm^{-3}$ Zn) contact layer 19.

Figure 2:
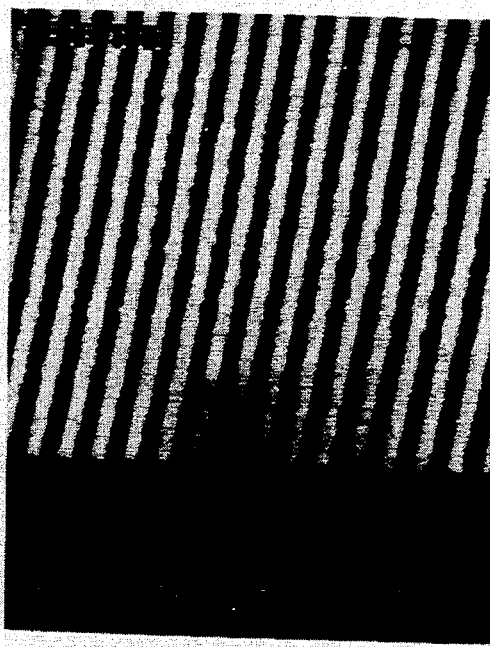
FIGS. 2 to 4 are electron micrographs of an "as etched" grating and of gratings that were heat treated without, and with, benefit of a grating-preserving treatment according to the invention, respectively.

FIG. 2 shows an electron micrograph of a grating (240 nm repeat distance) formed on an InP wafer by conventional reactive ion etching. Samples with a grating as shown in FIG. 2 were heat treated under a $H_2 + PH_3$ atmosphere for five minutes at 640° C. These conditions are expected to be more severe than those normally encountered in grating overgrowth, e.g., by MOCVD, and were chosen to demonstrate the efficacy of the novel grating-preserving treatment.

Figure 3:
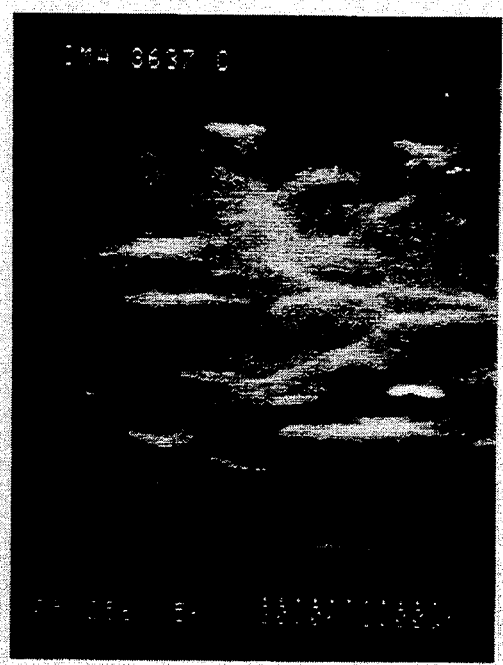
Figure 4:

FIGS. 3 and 4 are electron micrographs (identical magnification) of gratings subjected to the above-described treatment, with the sample of FIG. 3 not having received any sulfur treatment, and the sample of FIG. 4 having received the above described treatment (10 minutes in 60° C. 80/20 by weight $H_2O:(NH_4)_2S$). The effectiveness of the treatment is apparent from the micrographs.

We have also made Hall effect measurements on control samples and sulfur treated samples and have found no significant electrical difference between them.

We currently believe that the novel treatment involves the creation of a very thin film (~monolayer thickness) which bonds with In (and/or P) in such a way as to reduce the surface mobility of In atoms. These remarks are offered for tutorial reasons only, and the claimed invention does not depend on the validity of the suggested mechanism.

We claim:

1. A method of making an article comprising an InP-based semiconductor laser, the method comprising
   a) providing a semiconductor body that comprises InP and has a major surface;
   b) processing the body such that on at least a portion of the surface an essentially regular sequence of elevated and depressed elongate features is formed, said sequence of features to be referred to as a grating means;
   c) heating the body to a deposition temperature and depositing at least on the grating means epitaxial semiconductor material; and
   d) carrying out one or more further steps towards completion of the article;
   CHARACTERIZED IN THAT the method further comprises
   e) contacting, prior to step c), the grating with a sulfur-containing aqueous medium, and depositing said epitaxial material by a vapor deposition technique.

2. The method of claim 1, wherein step e) is carried out such that, subsequent to deposition of semiconductor material on the grating means, the residual depth of the grating means is at least 10% of the as-etched depth.

3. The method of claim 2, wherein the aqueous medium is at a temperature in the range 50°-80° C., wherein the time of contact is in the range 5-30 minutes, and wherein the medium contains at least 1 mmole sulfur.

4. The method of claim 3, wherein the aqueous medium comprises ammonium sulfide.

5. The method of claim 2, wherein said residual depth is at least 90%.

6. The method of claim 1, wherein the vapor deposition technique is metal organic vapor phase epitaxy.

* * * * *